United States Patent
Mohapatra et al.

(10) Patent No.: US 10,855,241 B2
(45) Date of Patent: Dec. 1, 2020

(54) ADJUSTING AN EQUALIZER BASED ON AUDIO CHARACTERISTICS

(71) Applicant: Sony Corporation, Tokyo (JP)

(72) Inventors: Bibhudendu Mohapatra, San Diego, CA (US); Hyehoon Yi, San Diego, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/204,924

(22) Filed: Nov. 29, 2018

(65) Prior Publication Data
US 2020/0177146 A1 Jun. 4, 2020

(51) Int. Cl.
*H04R 3/04* (2006.01)
*H03G 5/16* (2006.01)
*H04R 29/00* (2006.01)

(52) U.S. Cl.
CPC ............. *H03G 5/165* (2013.01); *H04R 3/04* (2013.01); *H04R 29/001* (2013.01); *G10H 2210/036* (2013.01)

(58) Field of Classification Search
CPC .......... H03G 3/002; H03G 9/00; H03G 3/301; H03G 5/005; H03G 5/165; G06F 3/165; H04R 3/04
USPC .................................. 381/103, 102, 107, 58
See application file for complete search history.

(56) References Cited

U.S. PATENT DOCUMENTS

| | | | | |
|---|---|---|---|---|
| 9,053,710 | B1 * | 6/2015 | Zehr | H03G 5/165 |
| 9,998,082 | B1 * | 6/2018 | Anderton | H03G 3/301 |
| 10,044,337 | B2 | 8/2018 | Lu et al. | |
| 2005/0180578 | A1 * | 8/2005 | Cho | G06F 3/165 |
| | | | | 381/56 |
| 2009/0290725 | A1 | 11/2009 | Huang | |
| 2016/0373197 | A1 * | 12/2016 | Brenner | H04H 60/47 |
| 2017/0070817 | A1 * | 3/2017 | Seo | H04R 3/04 |

FOREIGN PATENT DOCUMENTS

WO WO2005106843 A1 11/2005

OTHER PUBLICATIONS

Marie Gonzalez, Patricio de la Cuadra, Rodrigo F. Cadiz; "Fuzzy Equalization of Musical Genres"; quod.lib.umich.edu; 2015; pp No. 134-137.

* cited by examiner

*Primary Examiner* — Vivian C Chin
*Assistant Examiner* — Ubachukwu A Odunukwe
(74) *Attorney, Agent, or Firm* — Trellis IP Law Group, PC

(57) ABSTRACT

Implementations generally relate to automated equalizer adjustments based on audio characteristics. In some implementations, a method includes detecting music that is being currently played on an audio device. The method further includes adjusting one or more equalizer settings of an equalizer device based at least in part on a music genre associated with the music. The method further includes outputting the music based at least in part on the adjusting of the one or more equalizer settings of the equalizer device.

20 Claims, 6 Drawing Sheets

ADJUSTING AN EQUALIZER BASED ON AUDIO CHARACTERISTICS

BACKGROUND

Technology advances have enabled users to access and listen to many different types of music genres such as pop, rock, metal, jazz, electronic dance music (EDM), classical, etc. Some audio devices allow users to change an equalizer in order to adjust bass or treble. Such an adjustment to the equalizer essentially adjusts specific frequencies in order to enhance the music listening experience of the user. Some audio devices do not allow such adjustments. Even if an audio device allows a user to make equalizer adjustments, the user typically needs to manually change the equalizer settings, which can be a difficult process, especially when the user is not knowledgeable in the particular music genre.

SUMMARY

Implementations generally relate to automated equalizer adjustments based on audio characteristics. In some implementations, a system includes one or more processors, and includes logic encoded in one or more non-transitory computer-readable storage media for execution by the one or more processors. When executed, the logic is operable to cause the one or more processors to perform operations including detecting music that is being currently played on an audio device; adjusting one or more equalizer settings of an equalizer device based at least in part on a music genre associated with the music; and outputting the music based at least in part on the adjusting of the one or more equalizer settings of the equalizer device.

With further regard to the system, in some implementations, the music genres include one or more of pop music, rock music, jazz music, electronic dance music, and classical music. In some implementations, the one or more equalizer settings include bass and treble. In some implementations, to determine the music genre associated with the music, the logic when executed is further operable to cause the one or more processors to perform operations including: receiving audio sound at an input of the audio device; characterizing the audio sound; and determining the music genre based at least in part on the characterizing of the audio sound. In some implementations, to determine the music genre associated with the music, the logic when executed is further operable to cause the one or more processors to perform operations including: sampling a first portion of the music; and determining the music genre based at least in part on the first portion of the music. In some implementations, the logic when executed is further operable to cause the one or more processors to perform operations including: learning from one or more manual adjustments performed by a user; and adjusting one or more of the equalizer settings of an equalizer device based at least in part on the music genre and based at least in part on the one or more manual adjustments. In some implementations, the logic when executed is further operable to cause the one or more processors to perform operations including: detecting one or more manual adjustments to one or more of the equalizer settings of the equalizer device, where the one or more manual adjustments result in one or more respective manually adjusted equalizer settings; and storing the one or more manually adjusted equalizer settings.

In some embodiments, a non-transitory computer-readable storage medium with program instructions thereon is provided. When executed by one or more processors, the instructions are operable to cause the one or more processors to perform operations including: detecting music that is being currently played on an audio device; adjusting one or more equalizer settings of an equalizer device based at least in part on a music genre associated with the music; and outputting the music based at least in part on the adjusting of the one or more equalizer settings of the equalizer device.

With further regard to the computer-readable storage medium, in some implementations, the music genre includes one or more of pop music, rock music, jazz music, electronic dance music, and classical music. In some implementations, the one or more equalizer settings include bass and treble. In some implementations, to determine the music genre associated with the music, the instructions when executed are further operable to cause the one or more processors to perform operations including: receiving audio sound at an input of the audio device; characterizing the audio sound; and determining the music genre based at least in part on the characterizing of the audio sound. In some implementations, to determine the music genre associated with the music, the instructions when executed are further operable to cause the one or more processors to perform operations including: sampling a first portion of the music; and determining the music genre based at least in part on the first portion of the music. In some implementations, the instructions when executed are further operable to cause the one or more processors to perform operations including: learning from one or more manual adjustments performed by a user; and adjusting one or more of the equalizer settings of an equalizer device based at least in part on the music genre and based at least in part on the one or more manual adjustments. In some implementations, the instructions when executed are further operable to cause the one or more processors to perform operations including: detecting one or more manual adjustments to one or more of the equalizer settings of the equalizer device, where the one or more manual adjustments result in one or more respective manually adjusted equalizer settings; and storing the one or more manually adjusted equalizer settings.

In some implementations, a method includes detecting music that is being currently played on an audio device. The method further includes adjusting one or more equalizer settings of an equalizer device based at least in part on a music genre associated with the music. The method further includes outputting the music based at least in part on the adjusting of the one or more equalizer settings of the equalizer device.

With further regard to the method, in some implementations, the music genre includes one or more of pop music, rock music, jazz music, electronic dance music, and classical music. In some implementations, the one or more equalizer settings include bass and treble. In some implementations, to determine the music genre associated with the music, the method further includes: receiving audio sound at an input of the audio device; characterizing the audio sound; and determining the music genre based at least in part on the characterizing of the audio sound. In some implementations, to determine the music genre associated with the music, the method further includes: sampling a first portion of the music; and determining the music genre based at least in part on the first portion of the music. In some implementations, the method further includes: learning from one or more manual adjustments performed by a user; and adjusting one or more of the equalizer settings of an equalizer device based at least in part on the music genre and based at least in part on the one or more manual adjustments.

A further understanding of the nature and the advantages of particular implementations disclosed herein may be realized by reference of the remaining portions of the specification and the attached drawings.

DETAILED DESCRIPTION

Implementations described herein adjust an equalizer based on audio characteristics. Implementations dynamically change equalizer settings based on audio that is currently playing. Implementations identify the particular genre of music and adjust the frequencies for a better listening experience for the user. As a result, the user does not need to manually change equalizer settings.

Figure 1:
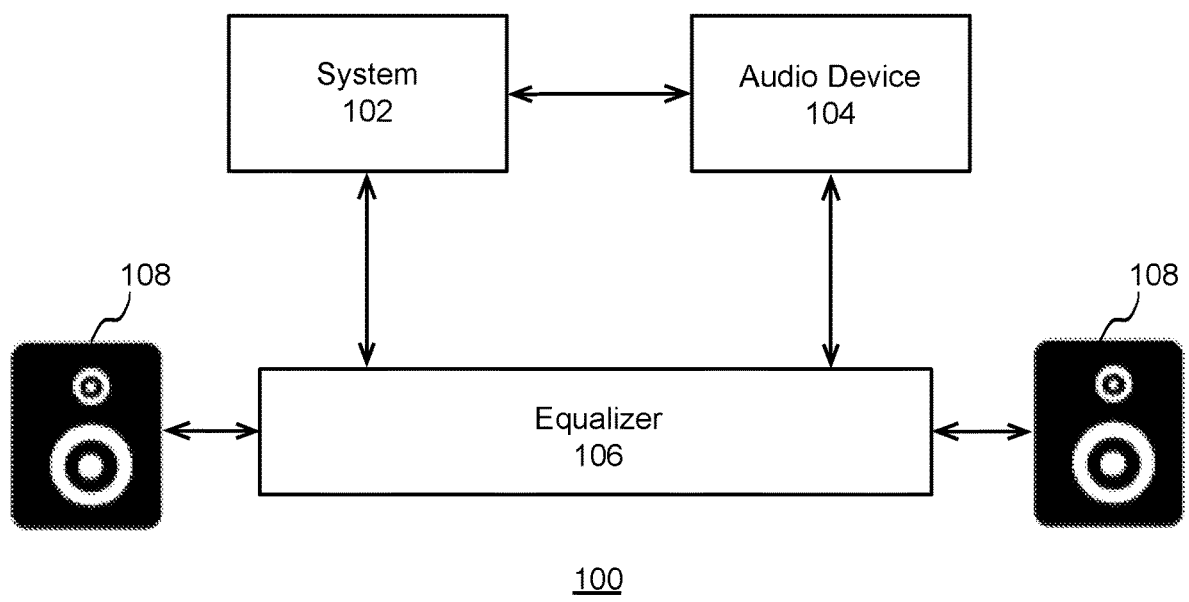
FIG. 1 illustrates a block diagram of an example media environment, according to some implementations.

FIG. 1 illustrates a block diagram of an example media environment 100, according to some implementations. In some implementations, media environment 100 includes a system 102, an audio device 104, an equalizer device or equalizer 106, and speakers 108.

As described in more detail herein, in various implementations, system 102 of media environment 100 detects music that is being currently played on audio device 104. The music may be sourced by a local or remote storage device, or may be streamed from an online source. System 102 then determines the music genre associated with the music. For example, system 102 may determine whether the music genre is pop music, rock music, jazz music, classical music, etc. System 102 then adjusts one or more equalizer settings of equalizer 106 based at least in part on the music genre. System 102 then outputs the music or causes the music to be outputted (e.g., outputted to speakers 108) based on the equalizer adjustments.

For ease of illustration, system 102 is shown as a device or unit that is separate from audio device 104, and an equalizer device or equalizer 106. System 102 may reside in various suitable locations, depending on the particular implementation. For example, in various implementations, system 102 may be integrated into audio device 104 or into equalizer 106 or into another device such as a desktop computer, laptop computer, tablet, smartphone, etc. While some implementations are described herein in the context of the system residing in media environment 100, these implementations also apply to the system residing in other devices or located in other locations (e.g., in the cloud). In some implementations, system 102 may be referred to as a master media device, and the other devices such as audio device 104 and equalizer 106 may be referred to as slave media devices.

In various implementations, system 102, audio device 104, and equalizer 106 may be connected to each other via any suitable means such as high-definition multimedia interface (HDMI) cables, HDMI-consumer electronics control (HDMI-CEC) or other digital means (e.g., fiber optic interfaces, Wi-Fi, Bluetooth, etc.).

In other implementations, media environment 100 may not have all of the components shown and/or may have other elements including other types of elements instead of, or in addition to, those shown herein. In the various implementations described herein, a processor of television 102 may cause the elements described herein (e.g., settings, commands, messages, user preferences, etc.) to be displayed in a user interface on one or more display screens.

While some implementations are described herein in the context of a single media device (e.g., equalizer 106), these implementations and others also apply to multiple media devices that are connected to system 102. For example, implementations described herein may include the system configuring adjustments to speakers 108, or any other media device connected to television 102.

Figure 2:
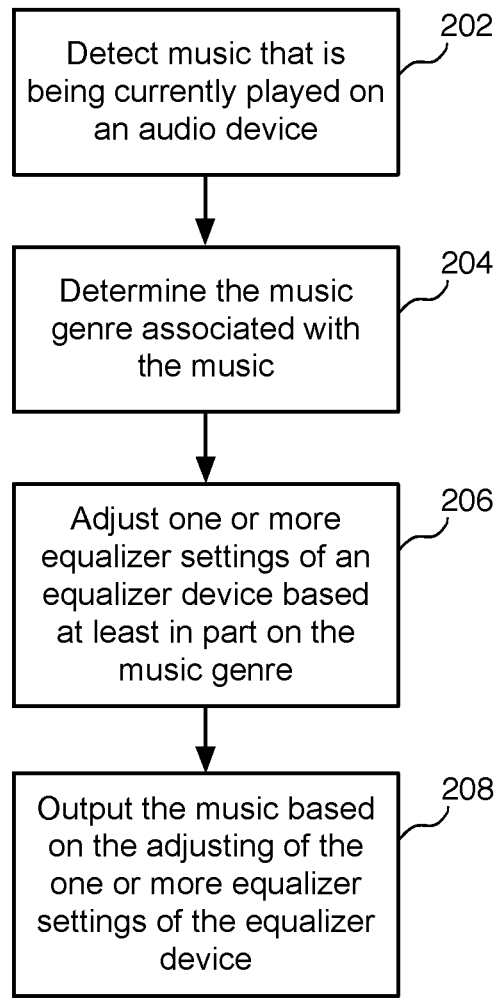
FIG. 2 is an example flow diagram for adjusting an equalizer based on audio characteristics, according to some implementations.

FIG. 2 is an example flow diagram for adjusting an equalizer based on audio characteristics, according to some implementations. Referring to both FIGS. 1 and 2, a method is initiated at block 202, where the system such as system 102 detects music that is being currently played on an audio device. The music may be sourced by a local or remote storage device, or may be streamed from an online source.

In various implementations, the music may be from to a full song or a portion of a song. For example, if a portion of a song, the music may be an introduction, a verse, a chorus, a bridge, outroduction, etc. These labels for portions of songs are examples, and the particular portion of a given song that the system analyzes and labels for the particular portion may vary, depending on the particular music genre and implementation.

At block 204, the system determines the music genre associated with the music. The particular music genre may vary, depending on the particular implementation. For example, in various implementations, the music genre may be one of pop music, rock music, jazz music, electronic dance music, classical music, etc. In various implementations, the system determines the music genre based at least in part on the audio characteristics of the music. Example implementations directed to determining the music genre associated with the music is described in more detail herein, in FIG. 3 for example.

At block 206, the system adjusts one or more equalizer settings of the equalizer device based at least in part on the music genre. In some implementations, the one or more equalizer settings include bass and treble. The particular equalizer settings, including frequency ranges, will vary, and will depend on the particular implementation. Example implementations directed to the adjustment of equalizer settings are described in more detail herein, in FIGS. 3 and 4 for example.

At block 208, the system outputs the music based at least in part on the adjusting of the one or more equalizer settings of the equalizer device. In other words, the system makes adjustments to one or more of the equalizer settings, and then outputs the music with the adjusted equalizer settings.

Figure 3:
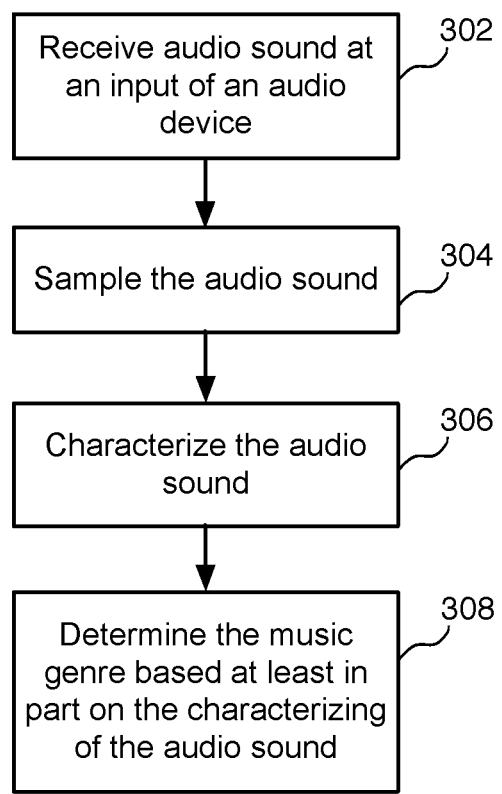
FIG. 3 is an example flow diagram for determining the music genre associated with the music, according to some implementations.

FIG. 3 is an example flow diagram for determining the music genre associated with the music, according to some implementations. As described in detail below, the system determines the music genre associated with the music based at least in part on the audio characteristics of the music. Referring to both FIGS. 1 and 3, to determine the music genre associated with the music, a method is initiated at block 302, where a system such as system 102 receives audio sound at an input of an audio device 104.

In various implementations, the audio sound refers to the sound of the music being currently played on audio device 104. The audio sound may refer the sound of the music from a full song or a portion of a song (e.g., introduction, a verse, a chorus, a bridge, outroduction, etc.).

At block 304, the system samples the audio sound. In particular, the system samples the audio sound of a first portion of the music being currently played. In various implementations, the first portion of the music is the beginning of a song. In some implementations, the first portion may be based at least in part on a predetermined time period. For example, the predetermined time period may be a predetermined number of seconds (e.g., 1.5 seconds, 5 seconds, 60 seconds, etc.).

As indicated above, the labels for portions of songs are examples, and the particular portion of a given song that the system analyzes and labels for the particular portion may vary, depending on the particular music genre and implementation. For example, if the system samples the first 60 seconds of audio sound, the portion being processed and analyzed may include a part of an introduction, an entire introduction, an entire introduction and an entire verse, or an entire introduction and a part of a verse, etc.

In some implementations, the system may take multiple samples of a predetermined time period of audio sound at different portions of the music. For example, in some implementations, the system may take a 5 second sample every 30 seconds or every 60 seconds.

At block 306, the system characterizes the audio sound. In various implementations, the system may use any suitable technique or techniques for characterizing the audio sound. For example, the system may use pattern recognition techniques to determine characteristics of the audio sound. For example, such characteristics may include values and ranges in frequencies, volume, rhythm, timbre, etc.

At block 308, the system determines the music genre based at least in part on the characterizing of the audio sound. In particular, the system determines the music genre based at least in part on the audio sound of the first portion of the music. In some implementations, the system may determine the music genre based on the first sample. In some implementations, the system may determine the music genre based on each successive sample, if the determined genre changes. In some implementations, if the determined music genre changes during the song, the system may dynamically adjust one or more the equalizer settings in order to correct or follow the currently determined genre. The system may make such adjustments gradually in order to minimize the user's ability to perceive the change.

In some implementations, the system may determine the music genre based on metadata stored with the music file. For example, the metadata may indicate if a given song is rock, country, etc. In some implementations, the system may ignore the metadata if the system detects a music genre that differs from the genre stated in the metadata. In some implementations, after determining the particular music genre of a given piece of music or song, the system may store the determined music genre for future use (e.g., if the user plays the same song at a future time.

In some implementations, the system matches the characteristics of the audio signal of the music to a particular genre, using any suitable matching technique or techniques. In some implementations, the system may read metadata to determine additional associated characteristics or features of the audio sound. For example, the metadata may include the artist, song name, album genre, song genre, etc. System may factor in such metadata in determining the music genre.

In some scenarios, the system may determine two or more possible music genres. The system may handle such situations in different ways. For example, in some implementations, the system may base its determination of music genres based on the first determination. In some implementations, the system may factor in two or more possible genres when adjusting equalizer settings in a manner consistent with both music genres.

As indicated herein, example equalizer settings may include bass and treble, etc. The particular label for a frequency range may vary depending on the particular implementation. Frequency ranges are typically in Hertz (Hz). For example, frequency ranges may include a sub bass range (e.g., ~20 Hz to 60 Hz), a bass range (e.g., ~60 Hz to 140 Hz), a mid-bass range (e.g., ~140 Hz to 400 Hz), a mid range (e.g., ~400 Hz to 2.6 kHz), an upper midrange (e.g., ~2.6 kHz to 5.2 kHz), a high end range (e.g., ~5.2 kHz to 20 hHz), etc. These are example values, and the particular label and particular corresponding frequency range may vary, depending on the particular implementation and equalizer device.

In various implementations, the system may make one frequency adjustment within a given frequency range (e.g., 31 Hz adjustment for the sub bass range), where the system may adjust a decibel (dB) setting (e.g., 31 Hz setting adjusted to +6 dB). In various implementations, the system may set an equalizer setting to the middle of a given frequency range or to a particular frequency, depending on the particular genre, implementation, and equalizer device. For example, in some implementations, the system may make multiple frequency adjustments within a given frequency range (e.g., 8 kHz adjustment to 6 dB and a 16 kHz adjustment to 8 dB for the high end range).

In some implementations, the system may further adjust for the speaker system such as for speakers 108. For example, the system may have information on the dynamic range of each speaker in the speak system. As such, the system made factor in enhanced features and/or capabilities of each speaker, including any frequency limitations of each speaker.

Figure 4:
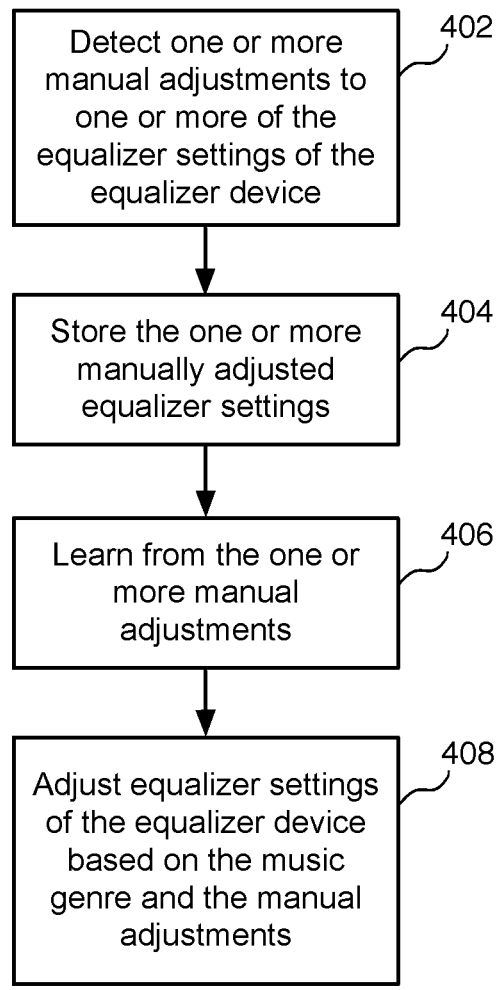
FIG. 4 is an example flow diagram for adjusting equalizer settings, according to some implementations.

FIG. 4 is an example flow diagram for adjusting equalizer settings, according to some implementations. As indicated above, the system may adjust equalizer settings based at least in part on the determined music genre. As described in detail below, the system may also adjust equalizer settings based at least in part on learned user preferences over time. Referring to both FIGS. 1 and 4, to determine the music genre associated with the music, a method is initiated at block 402, where a system such as system 102 detects one or more manual adjustments to one or more of the equalizer settings of the equalizer device. The adjustments are manual in that the adjustments are done by a user. Such manual adjustments result in one or more respective manually adjusted equalizer settings.

At block 404, the system stores the one or more manually adjusted equalizer settings. In various implementations, the system may store the equalizer settings in any suitable memory, which may be local or remote memory.

At block 406, the system learns from the one or more manual adjustments performed by a user. For example, in various implementations, the system may analyze each manual adjustment to determine whether it may bias future equalizer settings that the system automatically adjusts without user intervention. The system aggregates information from such manual adjustments in order to learn the user's preferences.

In some implementations, the system may bias particular equalizer settings based on one more predetermined biasing criteria. For example, the system may factor the following factors: which particular equalizer settings the user manually adjusted, how many times the user made such adjustments in the past, how frequent, for which music genres, the level of adjustment, etc.

At block 408, the system adjusts one or more of the equalizer settings of equalizer device 106 based at least in part on the music genre and based at least in part on the one or more manual adjustments. For example, presume the user always adjusts the equalizer settings to have a particular bass level for electronic dance music and for hip-hop music (e.g., 31 Hz turned up to 10 dB) but not for other music genres. The system may typically adjust the bass level upward for these music genres (e.g., 31 Hz turned up to 7 dB) but may bias the adjustment to 10 dB based on the analysis of previous manual adjustments.

In some scenarios, the user may have hearing requirements. For example, in some situations, the user may not hear frequencies above a particular frequency threshold (e.g., above 5 kHz), the user might manually adjust one or more settings in the treble frequency range upward (e.g., 4 kHz and 8 KHz turned up to 6 dB) for all music genres. As such, the system may override its usual adjustment of the treble frequency range and bias the adjustment upward (e.g., 4 kHz and 8 KHz turned up to 6 dB).

In various implementations, different equalizer devices may allow the user and/or the system to adjust different equalizer settings for different frequencies Hz and to different decibel levels dB, depending on the manufacturer and model. In some implementations, the system may be able to adjust more settings or frequencies than the equalizer 106 might manually allow, depending on the implementation and equalizer device.

Although the steps, operations, or computations may be presented in a specific order, the order may be changed in particular implementations. Other orderings of the steps are possible, depending on the particular implementation. In some particular implementations, multiple steps shown as sequential in this specification may be performed at the same time. Also, some implementations may not have all of the steps shown and/or may have other steps instead of, or in addition to, those shown herein.

Implementations described herein provide various benefits. For example, implementations improve the user experience by automatically, without user intervention, adjust an equalizer based on audio characteristics.

Figure 5:
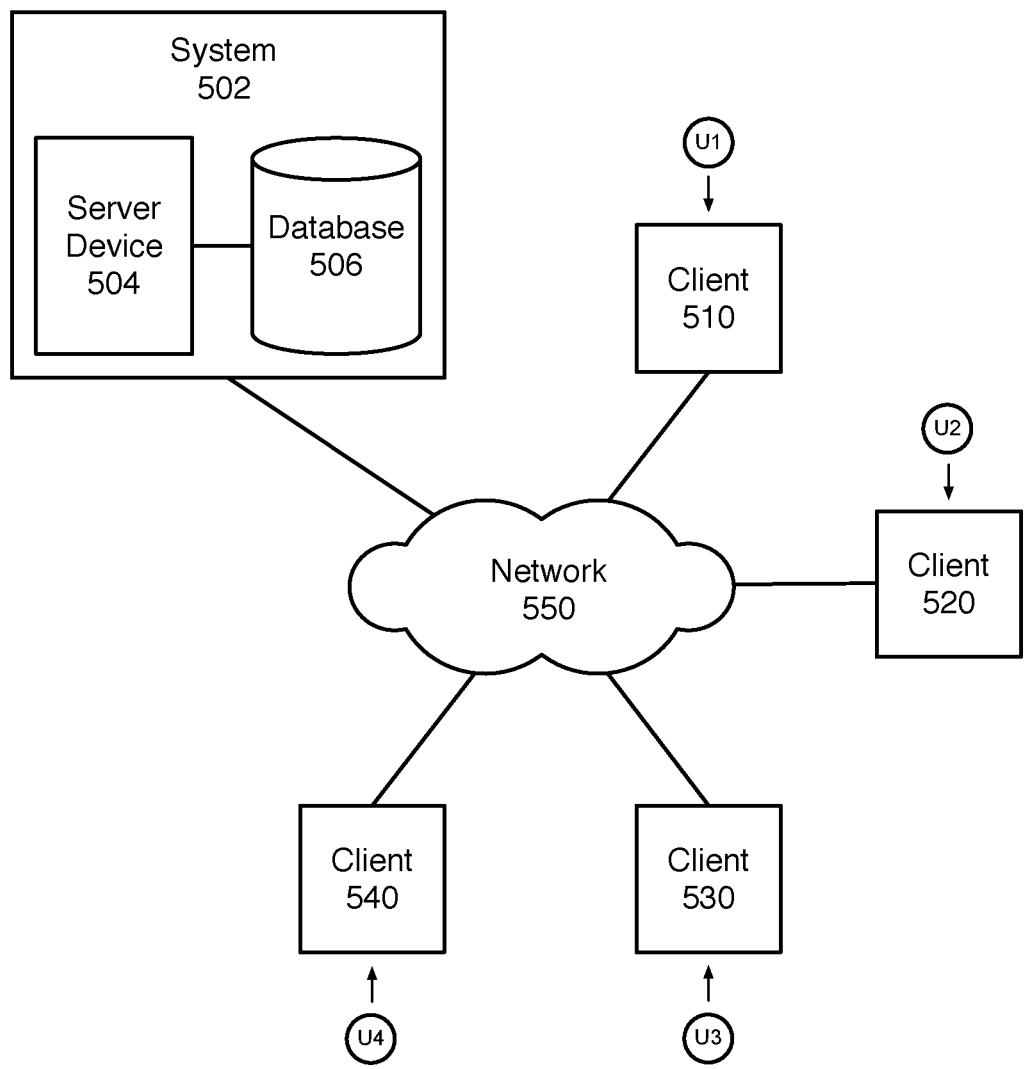
FIG. 5 is a block diagram of an example network environment, which may be used for some implementations described herein.

FIG. 5 is a block diagram of an example network environment 500, which may be used for implementations described herein. In some implementations, network environment 500 includes a system 502, which includes a server device 504 and a database 506. Network environment 500 also includes client devices 510, 520, 530, and 540, which may communicate with system 502 and/or may communicate with each other directly or via system 502. Network environment 500 also includes a network 550 through which system 502 and client devices 510, 520, 530, and 540 communicate. Network 550 may be any suitable communication network such as a Wi-Fi network, Bluetooth network, the Internet, etc.

In various implementations, system 502 may be used to implement system 102 of FIG. 1. Also, client devices 510, 520, 530, and 540 may be used to implement audio device 104, equalizer 106, and/or speakers 108, as well as other devices.

In various implementations, system 502 may represent a master device. Also, client devices 510, 520, 530, and 540 may represent other media devices in the media system. As indicated above, in various implementations, system 502 or the master device may be used to implement system 102 of FIG. 1, for example. As indicated above, in some implementations, system 502 or the master device may be integrated into another device in the media system, such as audio device 104 or equalizer 106, etc.

For ease of illustration, FIG. 5 shows one block for each of system 502, server device 504, and network database 506, and shows four blocks for client devices 510, 520, 530, and 540. Blocks 502, 504, and 506 may represent multiple systems, server devices, and databases. Also, there may be any number of client devices. In other implementations, network environment 500 may not have all of the components shown and/or may have other elements including other types of elements instead of, or in addition to, those shown herein.

While server 504 of system 502 performs embodiments described herein, in other embodiments, any suitable component or combination of components associated with server 502 or any suitable processor or processors associated with server 502 may facilitate performing the embodiments described herein.

Implementations may apply to any network system and/or may apply locally for an individual user. For example, implementations described herein may be implemented by system 502 and/or any client device 510, 520, 530, and 540. System 502 may perform the implementations described herein on a stand-alone computer, tablet computer, smartphone, etc. System 502 and/or any of client devices 510, 520, 530, and 540 may perform implementations described herein individually or in combination with other devices.

In the various implementations described herein, a processor of system 502 and/or a processor of any client device 510, 520, 530, and 540 causes the elements described herein (e.g., information, settings, etc.) to be displayed in a user interface on one or more display screens.

Figure 6:
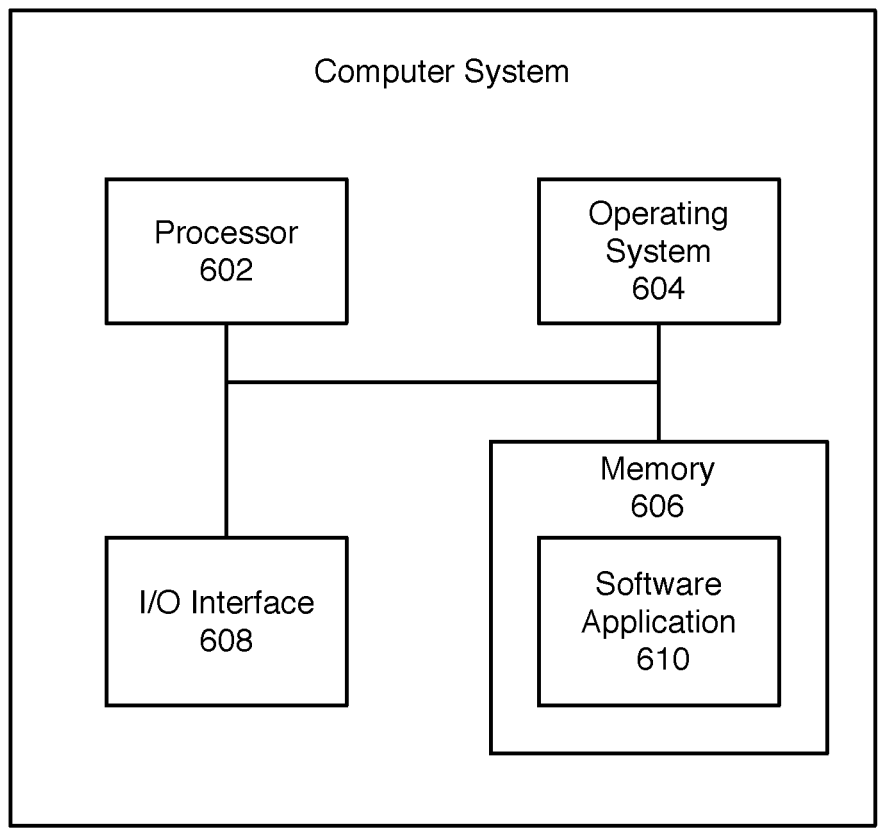
FIG. 6 is a block diagram of an example computer system, which may be used for some implementations described herein.

FIG. 6 is a block diagram of an example computer system 600, which may be used for some implementations described herein. For example, computer system 600 may be used to implement system 102 of FIG. 1 or server device 504 of FIG. 5, as well as to perform implementations described herein. In some implementations, computer system 600 may include a processor 602, an operating system 604, a memory 606, and an input/output (I/O) interface 608. In various implementations, processor 602 may be used to implement various functions and features described herein, as well as to perform the method implementations described herein. While processor 602 is described as performing implementations described herein, any suitable component or combination of components of computer system 600 or any suitable processor or processors associated with computer system 600 or any suitable system may perform the steps described. Implementations described herein may be carried out on a user device, on a server, or a combination of both.

Computer system 600 also includes a software application 610, which may be stored on memory 606 or on any other suitable storage location or computer-readable medium. Software application 610 provides instructions that enable processor 602 to perform the implementations described herein and other functions. Software application may also include an engine such as a network engine for performing various functions associated with one or more networks and network communications. The components of computer system 600 may be implemented by one or more processors or any combination of hardware devices, as well as any combination of hardware, software, firmware, etc.

For ease of illustration, FIG. 6 shows one block for each of processor 602, operating system 604, memory 606, I/O interface 608, and software application 610. These blocks 602, 604, 606, 608, and 610 may represent multiple processors, operating systems, memories, I/O interfaces, and software applications. In various implementations, computer system 600 may not have all of the components shown and/or may have other elements including other types of components instead of, or in addition to, those shown herein.

Although the description has been described with respect to particular embodiments thereof, these particular embodiments are merely illustrative, and not restrictive. Concepts illustrated in the examples may be applied to other examples and implementations.

In various implementations, software is encoded in one or more non-transitory computer-readable media for execution by one or more processors. The software when executed by one or more processors is operable to perform the implementations described herein and other functions.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a non-transitory computer-readable storage medium (also referred to as a machine-readable storage medium) for use by or in connection with the instruction execution system, apparatus, or device. Particular embodiments can be implemented in the form of control logic in software or hardware or a combination of both. The control logic when executed by one or more processors is operable to perform the implementations described herein and other functions. For example, a tangible medium such as a hardware storage device can be used to store the control logic, which can include executable instructions.

Particular embodiments may be implemented by using a programmable general purpose digital computer, and/or by using application specific integrated circuits, programmable logic devices, field programmable gate arrays, optical, chemical, biological, quantum or nanoengineered systems, components and mechanisms. In general, the functions of particular embodiments can be achieved by any means as is known in the art. Distributed, networked systems, components, and/or circuits can be used. Communication, or transfer, of data may be wired, wireless, or by any other means.

A "processor" may include any suitable hardware and/or software system, mechanism, or component that processes data, signals or other information. A processor may include a system with a general-purpose central processing unit, multiple processing units, dedicated circuitry for achieving functionality, or other systems. Processing need not be limited to a geographic location, or have temporal limitations. For example, a processor may perform its functions in "real-time," "offline," in a "batch mode," etc. Portions of processing may be performed at different times and at different locations, by different (or the same) processing systems. A computer may be any processor in communication with a memory. The memory may be any suitable data storage, memory and/or non-transitory computer-readable storage medium, including electronic storage devices such as random-access memory (RAM), read-only memory (ROM), magnetic storage device (hard disk drive or the like), flash, optical storage device (CD, DVD or the like), magnetic or optical disk, or other tangible media suitable for storing instructions (e.g., program or software instructions) for execution by the processor. For example, a tangible medium such as a hardware storage device can be used to store the control logic, which can include executable instructions. The instructions can also be contained in, and provided as, an electronic signal, for example in the form of software as a service (SaaS) delivered from a server (e.g., a distributed system and/or a cloud computing system).

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A system comprising:
one or more processors; and
logic encoded in one or more non-transitory computer-readable storage media for execution by the one or more processors and when executed operable to cause the one or more processors to perform operations comprising:
detecting music that is being currently played on an audio device, wherein the music comprises a song;
adjusting one or more equalizer settings of an equalizer device based at least in part on a music genre associated with the song and based at least in part on at least one change in the music genre during the song, wherein the adjusting of the one or more equalizer settings is performed gradually in order to minimize an ability of a user to perceive the at least one change; and
outputting the music based at least in part on the adjusting of the one or more equalizer settings of the equalizer device.

2. The system of claim 1, wherein the logic when executed is further operable to cause the one or more processors to perform operations comprising:
determining the at least one change in the music genre during the song; and adjusting the one or more the equalizer settings of the equalizer device during the song and based on the at least one change in the music genre during the song.

3. The system of claim 1, wherein the one or more equalizer settings comprise bass and treble.

4. The system of claim 1, wherein, to determine the music genre associated with the music, the logic when executed is further operable to cause the one or more processors to perform operations comprising:
receiving audio sound at an input of the audio device;
characterizing the audio sound; and
determining the music genre based at least in part on the characterizing of the audio sound.

5. The system of claim 1, wherein, to determine the music genre associated with the music, the logic when executed is further operable to cause the one or more processors to perform operations comprising:
sampling a first portion of the music; and
determining the music genre based at least in part on the first portion of the music.

6. The system of claim 1, wherein the logic when executed is further operable to cause the one or more processors to perform operations comprising:
learning from one or more manual adjustments performed by the user; and
adjusting one or more of the equalizer settings of an equalizer device based at least in part on the music genre and based at least in part on the one or more manual adjustments.

7. The system of claim 1, wherein the logic when executed is further operable to cause the one or more processors to perform operations comprising:
detecting one or more manual adjustments to one or more of the equalizer settings of the equalizer device, wherein the one or more manual adjustments result in one or more respective manually adjusted equalizer settings; and
storing the one or more manually adjusted equalizer settings.

8. A non-transitory computer-readable storage medium with program instructions stored thereon, the instructions when executed by one or more processors are operable to cause the one or more processors to perform operations comprising:
detecting music that is being currently played on an audio device, wherein the music comprises a song;
adjusting one or more equalizer settings of an equalizer device based at least in part on a music genre associated with the song and based at least in part on at least one change in the music genre during the song, wherein the adjusting of the one or more equalizer settings is performed gradually in order to minimize an ability of a user to perceive the at least one change; and
outputting the music based at least in part on the adjusting of the one or more equalizer settings of the equalizer device.

9. The computer-readable storage medium of claim 8, wherein the music genre comprises one or more of pop music, rock music, jazz music, electronic dance music, and classical music.

10. The computer-readable storage medium of claim 8, wherein the one or more equalizer settings comprise bass and treble.

11. The computer-readable storage medium of claim 8, wherein, to determine the music genre associated with the music, the instructions when executed are further operable to cause the one or more processors to perform operations comprising:
receiving audio sound at an input of the audio device;
characterizing the audio sound; and
determining the music genre based at least in part on the characterizing of the audio sound.

12. The computer-readable storage medium of claim 8, wherein, to determine the music genre associated with the music, the instructions when executed are further operable to cause the one or more processors to perform operations comprising:
sampling a first portion of the music; and
determining the music genre based at least in part on the first portion of the music.

13. The computer-readable storage medium of claim 8, wherein the instructions when executed are further operable to cause the one or more processors to perform operations comprising:
learning from one or more manual adjustments performed by the user; and
adjusting one or more of the equalizer settings of an equalizer device based at least in part on the music genre and based at least in part on the one or more manual adjustments.

14. The computer-readable storage medium of claim 8, wherein the instructions when executed are further operable to cause the one or more processors to perform operations comprising:
detecting one or more manual adjustments to one or more of the equalizer settings of the equalizer device, wherein the one or more manual adjustments result in one or more respective manually adjusted equalizer settings; and
storing the one or more manually adjusted equalizer settings.

15. A computer-implemented method comprising:
detecting music that is being currently played on an audio device, wherein the music comprises a song;
adjusting one or more equalizer settings of an equalizer device based at least in part on a music genre associated with the song and based at least in part on at least one change in the music genre during the song, wherein the adjusting of the one or more equalizer settings is performed gradually in order to minimize an ability of a user to perceive the at least one change; and
outputting the music based at least in part on the adjusting of the one or more equalizer settings of the equalizer device.

16. The method of claim 15, wherein the music genre comprises one or more of pop music, rock music, jazz music, electronic dance music, and classical music.

17. The method of claim 15, wherein the one or more equalizer settings comprise bass and treble.

18. The method of claim 15, wherein, to determine the music genre associated with the music, the method further comprises:
receiving audio sound at an input of the audio device;
characterizing the audio sound; and
determining the music genre based at least in part on the characterizing of the audio sound.

19. The method of claim 15, wherein, to determine the music genre associated with the music, the method further comprises:
sampling a first portion of the music; and
determining the music genre based at least in part on the first portion of the music.

20. The method of claim 15, further comprising:
learning from one or more manual adjustments performed by the user; and
adjusting one or more of the equalizer settings of an equalizer device based at least in part on the music genre and based at least in part on the one or more manual adjustments.

\* \* \* \* \*